T861022

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED APRIL 8, 1969

861 O.G. 368

763,397
PHOTOSENSITIVE COMPOSITION CONTAINING HEAT-HARDENABLE POLYMERS

Georges A. Phlipot and Simone J. Kempen, Vincennes, France

Filed Sept. 27, 1968. Published Apr. 8, 1969
Class 96—28
No Drawing. 25 Pages Specification

A photosensitive composition is described which comprises an amine-formaldehyde polymer such as a urea-formaldehyde resin or a melamine-formaldehyde resin, a photooxidizable organic sulfur compound such as a thioamide, a thiourea, a thiosemicarbazide, a dithiooxamide or a thiuram sulfide in an oxygen-permeable binder. Optionally, the photosensitive composition can contain a sensitizer such as a photosensitizing dye. The photosensitive composition is used to prepare photographic images by exposing to actinic radiation an element containing a layer of the photosensitive composition to harden the composition in photo-exposed areas, further hardening the composition in exposed areas by heating the element and developing an image by removing the unexposed, unhardened composition from the element.